(12) United States Patent
Bateman et al.

(10) Patent No.: US 9,064,760 B2
(45) Date of Patent: Jun. 23, 2015

(54) SUBSTRATE PROCESSING BASED ON RESISTIVITY MEASUREMENTS

(71) Applicant: Varian Semiconductor Equipment Associates, Inc., Gloucester, MA (US)

(72) Inventors: Nicholas P. T. Bateman, Reading, MA (US); Paul Sullivan, Wenham, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/897,698

(22) Filed: May 20, 2013

(65) Prior Publication Data

US 2014/0342472 A1    Nov. 20, 2014

(51) Int. Cl.
*G01R 31/26* (2014.01)
*H01L 21/66* (2006.01)

(52) U.S. Cl.
CPC ...................... *H01L 22/14* (2013.01)

(58) Field of Classification Search
CPC . H01L 21/0415; H01L 21/2026; H01L 22/00; H01L 22/14; H01L 51/0094; H01L 51/0096
USPC ............ 438/14, 753, 510, 514; 257/E21.042, 257/E21.043, E21.147, E21.248, E21.288, 257/E21.293, E21.333, E21.334, E21.347, 257/E21.521, 21.521 E
See application file for complete search history.

(56) References Cited

U.S. PATENT DOCUMENTS

| | | | | |
|---|---|---|---|---|
| 5,379,109 A | * | 1/1995 | Gaskill et al. | 356/445 |
| 5,848,842 A | * | 12/1998 | Peuse et al. | 374/1 |
| 6,365,422 B1 | * | 4/2002 | Hewett et al. | 438/14 |
| 7,078,919 B2 | * | 7/2006 | Prussin | 324/719 |
| 7,541,285 B2 | * | 6/2009 | Abiko et al. | 438/689 |
| 8,043,468 B2 | * | 10/2011 | Osawa et al. | 156/345.18 |
| 2005/0112853 A1 | | 5/2005 | Kuzbyt et al. | |
| 2005/0218344 A1 | | 10/2005 | Starcher | |
| 2010/0302547 A1 | | 12/2010 | Moll | |

FOREIGN PATENT DOCUMENTS

| | | |
|---|---|---|
| JP | 10-172917 A | 6/1998 |
| JP | 2007-281064 A | 10/2007 |

OTHER PUBLICATIONS

International Search Report and Written Opinion mailed Sep. 26, 2014 for PCT Application, PCT/US2014/038455 filed May 16, 2014.

* cited by examiner

*Primary Examiner* — David Nhu

(57) ABSTRACT

The resistivity of a silicon boule may vary along its length, thereby making a uniform ion implantation process sub-optimal. A system and method for measuring a resistivity of a substrate, and processing the substrate based on that measured resistivity is disclosed. The system includes a resistivity measurement system, a controller and an ion implanting system, where the controller configures the ion implantation process based on the measured resistivity of the substrate.

17 Claims, 4 Drawing Sheets

SUBSTRATE PROCESSING BASED ON RESISTIVITY MEASUREMENTS

FIELD

This application relates to a method of determining the inherent resistivity of a substrate, and adjusting the subsequent processing of the substrate.

BACKGROUND

Solar cells typically utilize a p-n junction to separate electron-hole pairs that are created by photons penetrating the substrate. This may be achieved by disposing a p-type region adjacent to an n-type region. Traditionally, one of these regions, such as the n-type region, may be provided through the use of a previously doped bulk material. For example, the bulk silicon used to create a solar cell may be n-type silicon. Methods of creating bulk silicon with n-type or p-type dopants incorporated therein are well known in the art. One surface of this bulk n-type silicon is then doped with p-type ions to create a p-type region, adjacent to the remainder of the n-type bulk silicon.

Variations in the resistivity of the bulk silicon may have an adverse impact on the efficiency of the solar cell. For example, high resistivity of the bulk silicon may decrease lateral carrier mobility, which negatively impacts series resistance and therefore fill factor. While the resistivity of the bulk material may impact solar cell performance, few techniques are currently employed to determine and counteract the affect of high resistivity of the bulk material.

Therefore, an improved method of processing a substrate, using information related to the bulk material's resistivity, is needed.

SUMMARY

The resistivity of a silicon boule may vary along its length, thereby making a uniform ion implantation process sub-optimal. A system and method for measuring a resistivity of a substrate, and processing the substrate based on that measured resistivity is disclosed. The system includes a resistivity measurement system, a controller and an ion implanting system, where the controller configures the ion implantation process based on the measured resistivity of the substrate.

In one embodiment, a method of processing substrates is disclosed, which comprises measuring a resistivity of a first substrate; and processing a second substrate based on said measured resistivity to achieve a desired sheet resistance. In a further embodiment, the first and second substrates may be the same substrate, such that the processing is performed on the same substrate that was measured.

In another embodiment, an apparatus for processing substrates is disclosed, which comprises a measurement station to measure resistivity of the substrates; a controller to determine a dose based on the measured resistivity; and an ion implanter to implant the dose in the substrates. In a further embodiment, the controller is in communication with a database, wherein the controller stores the measured resistivity of the substrates and an indication of the substrates in the database, wherein the controller identifies a substrate in the ion implanter based on the indication, and wherein the dose for the identified substrate is based on the measured resistivity of the substrate.

In another embodiment, a method of processing a substrate to form a solar cell is disclosed, which comprises measuring a resistivity of the substrate; storing the measured resistivity in a database; selecting a dose to be used in the creation of a back surface field (BSF) based on the stored measured resistivity; and implanting ions into the substrate using the selected dose to create the BSF.

BRIEF DESCRIPTION OF THE FIGURES

For a better understanding of the present invention, reference is made to the accompanying drawings, which are incorporated herein by reference and in which.

DETAILED DESCRIPTION

As described above, the bulk silicon may have varying resistivity. For example, phosphorus doped bulk silicon created using the Czochralski process may have resistivity variability along the boule. This may be due to the liquid/solid segregation of phosphorus. Because of this, one end of the boule may have a resistivity that is noticeably different than the opposite end.

High resistivity of the bulk silicon may degrade the performance of a solar cell. However, for passivated emitter and rear total (PERT) solar cells, this high bulk resistivity may be counteracted by the introduction of a highly dosed back surface field (BSF). The BSF may provide a more conductive lateral path for majority carriers. Thus, in high resistivity substrates, a highly dosed BSF may decrease sheet resistance. However, in substrates having lower bulk resistivity, reduced doses for the BSF may be advantageous. Thus, a single uniform dose for the BSF, which is independent of the bulk resistivity, may compromise the performance of all solar cells.

In other words, in some embodiments, it may be desirable that all processed substrates have a series resistance within a certain range. Differences in the underlying resistivity of the substrate require variations in the BSF sheet resistance to ensure consistent series resistance. The variations in the BSF sheet resistance may require changes in the processing of the substrates. Thus, by measuring the resistivity and processing the substrate based on that resistivity, the processed substrates can achieve the desired sheet resistance.

Figure 1:
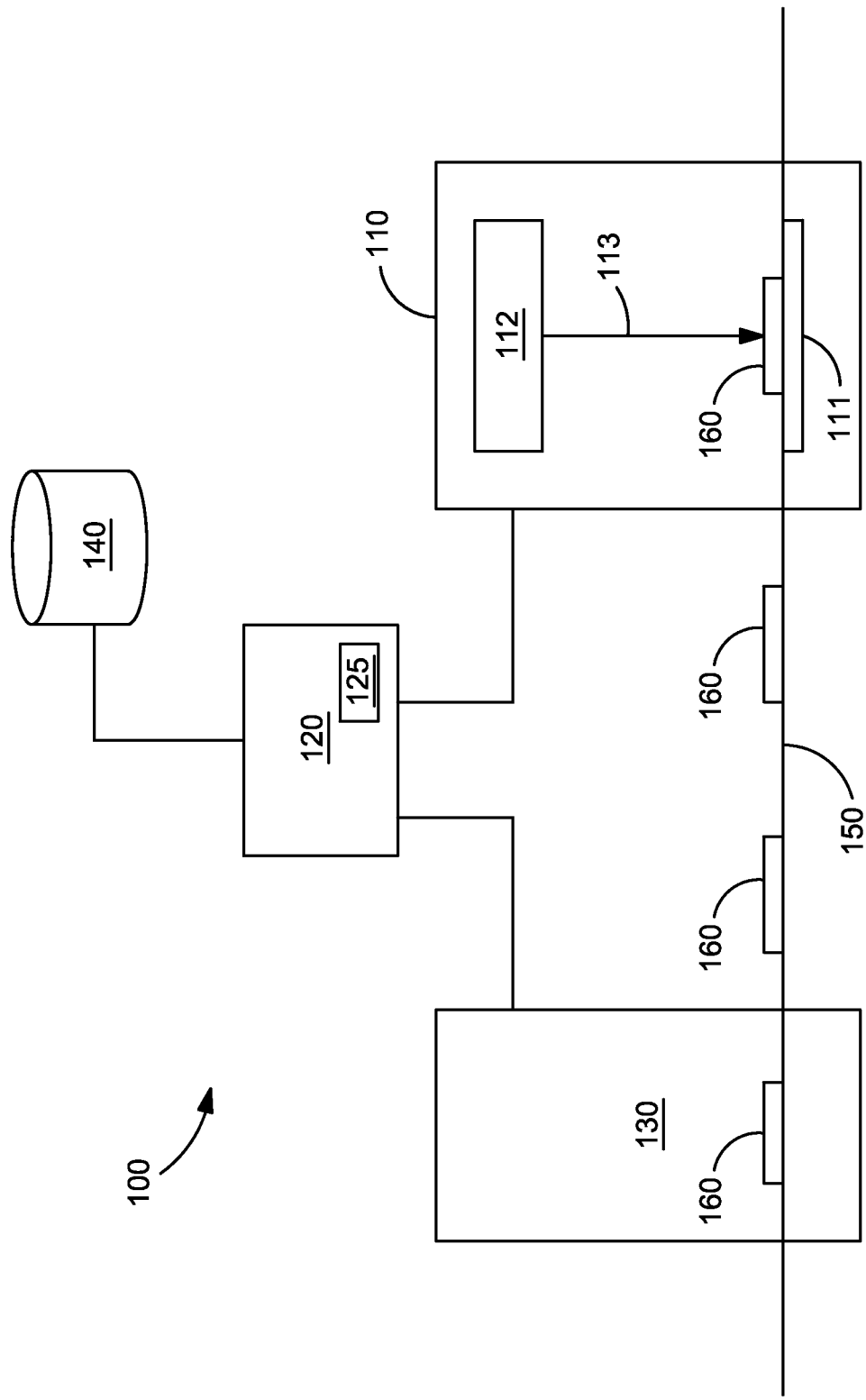
FIG. 1 shows a system which may be used in accordance with one embodiment.

FIG. 1 shows a system which may be used in accordance with one embodiment. The system 100 includes an ion implanter 110, which is used to introduce ions into the substrate. The ion implanter 110 may include an ion beam generator 112, and a platen 111. The ion beam generator 112 is configured to generate the ion beam 113 and direct it towards a front surface of the substrate 160. The ion beam generator 112 may include many components known to those skilled in the art, such as an indirectly heated cathode ion source, an RF ion source, an extraction assembly positioned proximate an extraction aperture of the ion source, a mass analyzer, acceleration/deceleration lenses, etc. to provide the ion beam 113 having desired characteristics, such as beam current, uniformity, and energy levels. The ion implanter 110 has been described as a beam line or flood ion implanter but a plasma doping implanter may also be utilized to treat the substrate. Those skilled in the art will recognize a plasma doping implanter positions the substrate 160 in a processing chamber where plasma is generated.

The system 100 also includes a measurement station 130, which is used to measure an electrical property of the substrate 160. For example, the measurement station 130 may measure the resistivity of the substrate 160 by disposing a plurality of probes (not shown) in electrical contact with the surface of the substrate 160. A voltage may be applied to one of these probes and the current is measured at the other probes. Alternatively, a current may be applied to one probe and the voltage is measured at the other probes. This measurement technique allows the calculation of resistance of the substrate 160. Of course, other mechanisms may be used to measure the resistivity of the substrate 160.

Alternatively the measurement station 130 may use a magnetic field to induce eddy currents in the substrate 160. The magnetic field may be applied and then removed and the decay of the induced eddy currents monitored to determine the resistivity, or an AC magnetic field may be applied and the phase angle between the applied magnetic field and the induced eddy currents may be monitored to determine the resistivity of the substrate 160.

The system 100 may also include automated substrate handling equipment, such as a conveyance system 150, for transferring substrates 160 between the measurement station 130 and the platen 111. The conveyance system 150 may be one or more robots, conveyor belt, or other mechanisms known to those skilled in the art. In some embodiments, the substrate 160 enters the measurement station 130 prior to entering the ion implanter 110, although the opposite order may also be used.

The system 100 also includes a controller 120 in communication with the measurement station 130 and the ion implanter 110. The controller 120 can be or may include a general-purpose computer or network of general-purpose computers that may be programmed to perform desired input/output functions. The controller 120 can also include other electronic circuitry or components, such as application specific integrated circuits, other hardwired or programmable electronic devices, discrete element circuits, etc. The controller 120 may also include communication devices, data storage devices, and software. The controller 120 is in communication with a non-transitory medium, such as a storage element 125. This storage element 125 contains instructions, which when executed by the controller 120, perform the steps and operations described herein. The controller 120 may receive input signals from a variety of systems and components such as the ion implanter 110, the ion beam generator 112, conveyance system 150, or the measurement station 130 and provide output signals to each to control the same. The controller 120 may also be in communication with a database 140. This database 140 may be disposed in the storage element 125, or may be disposed in a different storage element, which may be locally or remotely located.

In operation, the substrate 160 is transferred to the measurement station 130, such as by the substrate handling equipment. A conveyance system 150 may be used to move the substrates 160 between the measurement station 130 and the ion implanter 110. Thereafter, the controller 120 performs a resistivity measurement, using, for example, a plurality of probes. Based on the measurements obtained, a resistivity value of the particular substrate 160 can be determined. This value is then stored by the controller 120 in database 140. In addition, an indication of the identity of the substrate 160 may be stored with the measured resistivity value. This indication may be a scribe mark. In this embodiment, an optical system (not shown) may be utilized to detect the scribe mark at the ion implanter 110 in order to identify the substrate 160. In other embodiments, the indication of the identity of a substrate 160 may be based solely on the position of the substrate 160 in the processing order. For example, the controller 120 may be aware of the number of substrates disposed between the measurement station 130 and the ion implanter 110, and based on this, can correlate the substrate 160 in the ion implanter 110 to its information in the database 140.

Later, the substrate 160 is transferred by the handling equipment or conveyance system 150 to the ion implanter 110. The controller 120 identifies the substrate 160, and uses the database 140 to retrieve the resistivity measurement for this substrate. Based on its resistivity measurement, the control 120 modifies the operation of the ion implanter 110. In this way, the substrate 160 is processed in accordance with its measured resistivity value.

In other embodiments, the controller 120 tracks changes in resistivity at the measurement station 130. The resistivity of substrates in a boule may change gradually. Additionally, substrates as delivered to a customer may be arranged in roughly the order in which they were removed from the boule. In this case, it is not necessary to exactly identify a substrate with its measured resistivity. Rather, once the controller 120 identifies that the resistivity has changed, substrates 160 thereafter are processed differently.

Figure 2:
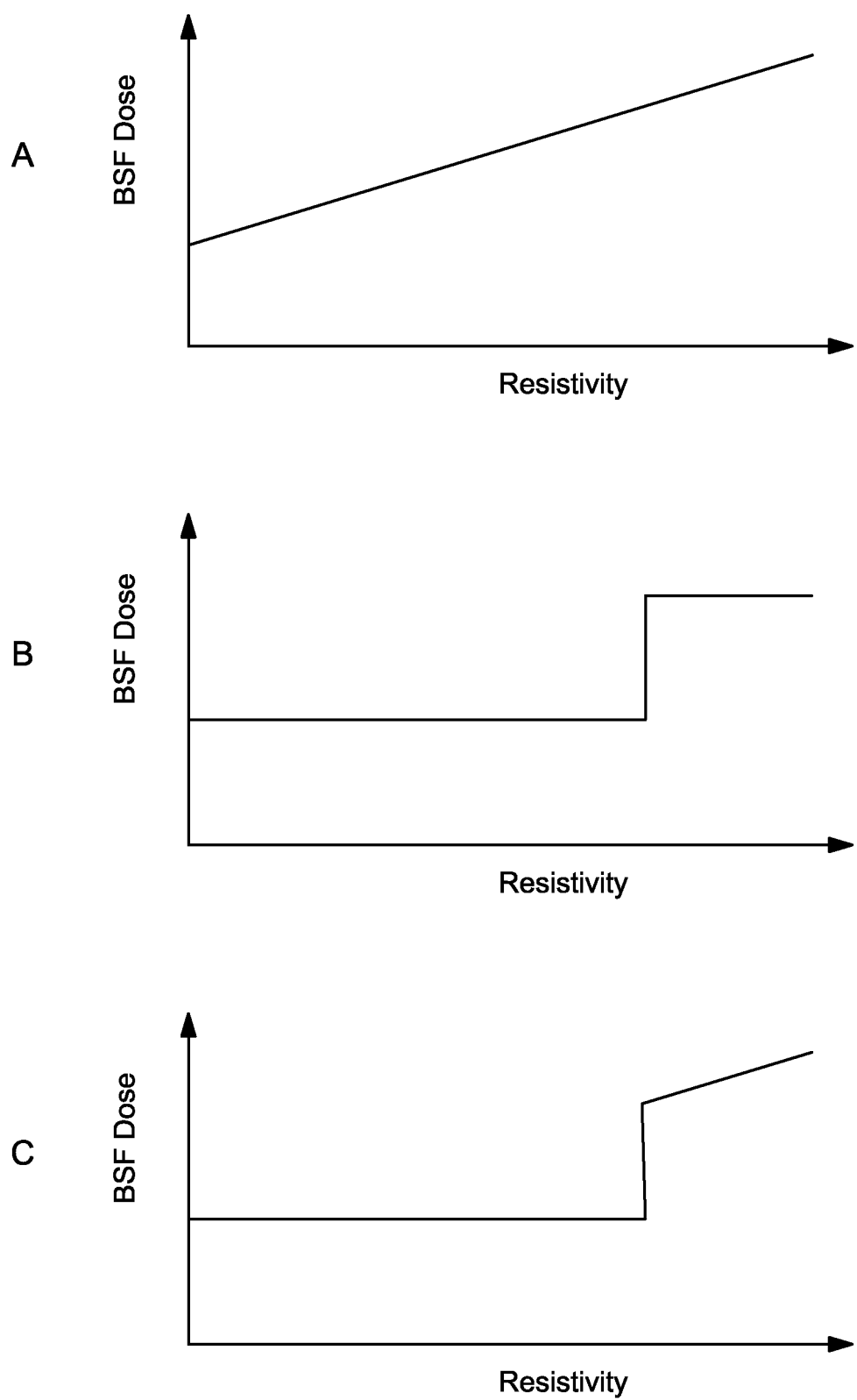
FIGS. 2A-2C show several embodiments of BSF dosing.

In one embodiment, shown in FIG. 2A, the dose used to create the BSF is based on the measured resistivity value. For example, the higher the resistivity of the bulk silicon, the higher the dose used for the BSF. Thus, a proportional relationship may exist between the measured resistivity value and the dose used for the BSF. While FIG. 2A shows a linear relationship, other relationships may also be used.

In another embodiment, a finite number of different doses are used by the ion implanter 110. For example, in one embodiment, shown in FIG. 2B, two different doses are used for the BSF. If the measured resistivity value exceeds a predetermined threshold, the higher dose is utilized. Otherwise, the lower dose is used. Of course, more than two dose values may be used in this embodiment.

In another embodiment, shown in FIG. 2C, a hybrid approach may be utilized. For example, the dose may be set to a first lower value for all resistivity values below a predetermined value. However, above that predetermined value, the dose may be determined based on the measured resistivity value.

The dose applied to the BSF may be varied using any technique known in the art. For example, the amount of time that ions are implanted into the substrate may be modified to adjust the total dose introduced, such as by changing scan speed or pulse rate of the ion beam. In other embodiments, the ion beam energy, the ion beam current, or ion beam angle may be modified to affect the total dose applied.

While the above description discloses that the ion implant process may be modified based on the resistivity measurement, other embodiments are also possible. For example, in another embodiment, the ion implant step may be identical for all substrates, regardless of resistivity value. Then, at a subsequent process step, such as the anneal step, the substrates may be processed differently based on their resistivity. For example, a higher thermal budget may be applied to substrates having a higher measured bulk resistivity. In some embodiments, a laser drive in step or an additional ion implant step may be added for high resistivity substrates. Additionally, a dopant paste may be applied to high resistivity substrates prior to the anneal process. In low resistivity substrates, an etch step can be added to remove dopant. Other process steps may also be modified according to measured resistivity. In each of these examples, the processing is varied to allow the processed substrate to have a sheet resistance within a certain range, regardless of its original measured resistivity. In other words, various process steps may be varied in order to create the desired sheet resistance.

Figure 3:
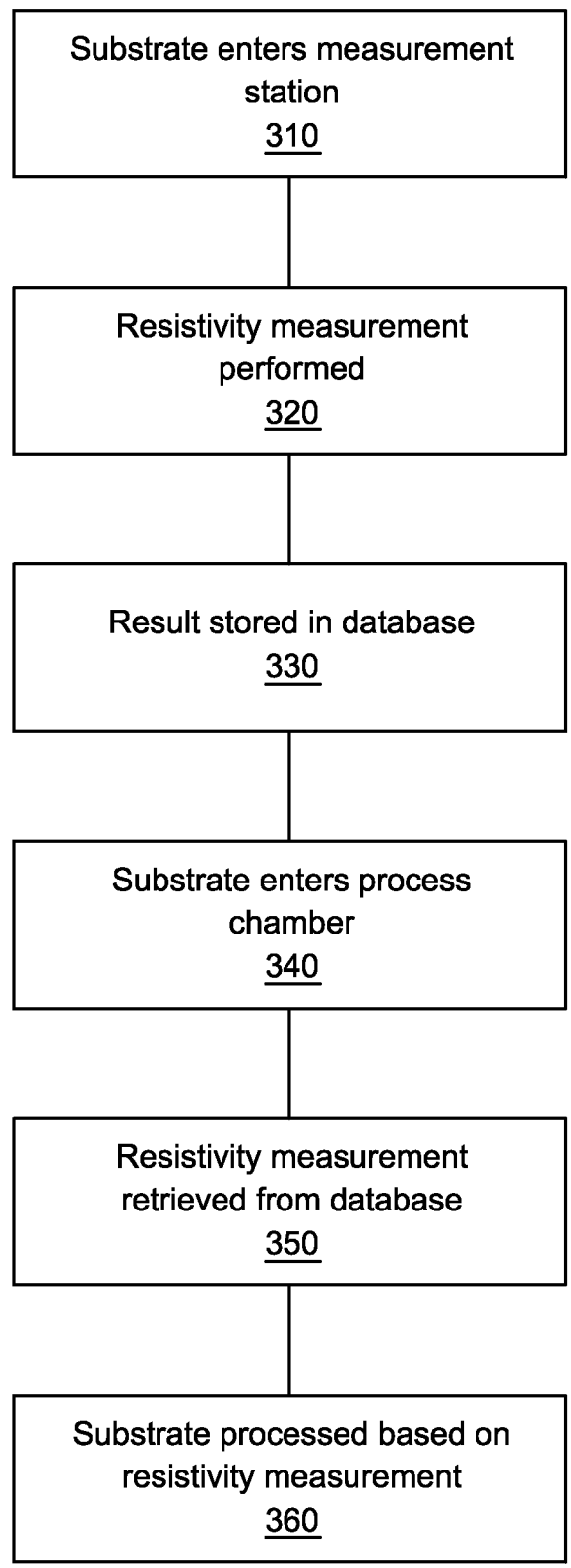
FIG. 3 shows a flowchart in accordance with one embodiment.

FIG. 3 shows a flowchart according to one embodiment. As shown in step 310, a substrate enters the measurement station 130. A resistivity measurement is then performed on the substrate, as shown in step 320. As described above, probes may be used to contact the surface of the substrate and pass a current therethrough to determine the resistance of the substrate.

The measured resistivity is then stored in a database, as shown in step 330. This resistivity value may be associated with the identity of the substrate. For example, an indicia may be located on the substrate which uniquely identifies it. In another embodiment, the substrate is identified based on its position in the batch.

Later, the substrate enters a process chamber, as shown in step 340. This process chamber may be ion implanter 110, an anneal station, or another process chamber. At this time, the controller 120 retrieves the resistivity measurement for this particular substrate from the database, as shown in step 350.

Finally, the substrate is processed based on this resistivity measurement, as shown in step 360. This processing may include variable dosing of the BSF, as described above. In other embodiments, this processing may include variable anneal processes to adjust the sheet resistance of the substrate. Other process variations, such as those described above, can also be performed based on the resistivity measurement.

It should be noted that steps 310-330 of FIG. 3 may be performed on an unprocessed substrate. However, in some embodiments, the substrate may already have been partially processed prior to entering the measurement station 130. For example, the substrate may be ion implanted, and then moved to the measurement station 130. In this case, the resistivity measurement may be used to control or adjust the anneal process that will be subsequently performed. In other words, the duration or temperature of an anneal cycle may be varied based on the measured resistivity.

Figure 4:
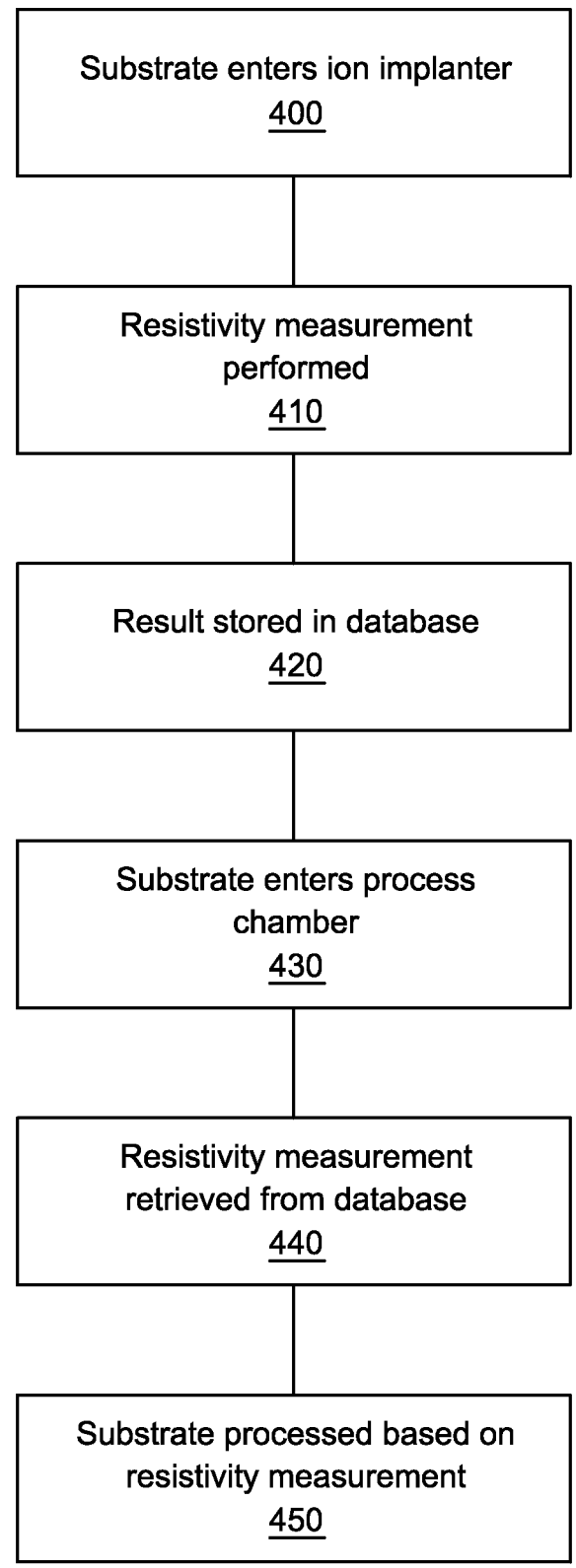
FIG. 4 shows a flowchart in accordance with a second embodiment.

FIG. 4 shows a flowchart according to this embodiment. First, as shown in step 400, the substrate is ion implanted. All substrates are identically implanted in this embodiment. After the substrate has been implanted, its resistivity is measured at the measurement station 130, as shown in step 410. This resistivity measurement is stored in the database, as shown in step 420. Subsequent to the resistivity measurement, the substrate enters a process chamber, as shown in step 430. The previously measured resistivity value is retrieved from the database, as shown in step 440. Based on this retrieved resistivity value, the substrate is processed as shown in step 450. In some embodiments, the process chamber is an anneal chamber, and the anneal cycle is varied based on the resistivity. For example, as stated above, the duration or temperature of the anneal may be modified based on the measured resistivity value. Additionally or alternatively, other process steps, such as laser drive in, additional ion implants, or application of dopant pastes may be performed in step 450 based on this resistivity measurement.

Additionally, this resistivity measurement could also provide feedback to the ion implanter to vary the dose for a subsequent substrate, based on the resistivity measured after ion implantation. For example, as described above, the resistivity of a batch of substrates may change gradually. Therefore, measuring the resistivity of a substrate after ion implantation and using that information to determine the dose of a subsequent substrate may be effective.

In some embodiments, like those described above, each substrate is processed individually, and therefore, the process step performed in step 360 may be modified for the resistivity of that particular substrate. However, in some embodiments, multiple substrates may be processed simultaneously. For example, a group of substrates may enter an anneal chamber and be processed together. Similarly, a group of substrates may be ion implanted at the same time. In these embodiments, it may not be possible to tailor the processing of each substrate individually.

In one embodiment, after the resistivity of each substrate is measured, the substrates are then sorted such that each group of substrates that are processed simultaneously possesses similar or nearly identical resistivity values. Thus, since all substrates in the group have similar characteristics, the processing is appropriate for all substrates in that group.

In this way, substrates can be sorted such that a group of substrates that is processed simultaneously all have similar characteristics. The process can then be varied for the next group of substrates. Thus, while a first group of substrates that are processed simultaneously uses a first set of process parameters, the next group of substrates may use a different set of parameters. Thus, a batch of substrates may be divided into smaller groups, where each group uses a common set of process parameters.

In another embodiment, sorting the substrates may not be desirable due to its complexity or impact on throughput. In this embodiment, the controller 120 retrieves the resistivity value for each substrate in the batch. It then performs some function on this set of resistivity values to calculate a batch resistivity value. In some embodiments, this function may be an averaging function. In other embodiments, this function may be a maximum function, where the largest resistivity value is selected as the batch resistivity value. In other embodiments, this function may be a different mathematical function.

In one particular embodiment, a maximum function is employed. In this way, most of the substrates in the batch receive a higher BSF dose than would otherwise be used. However, the inefficiencies caused by a higher dosed BSF in a lower resistivity substrate may be less than the inefficiencies caused by a lower dosed BSF in a higher resistivity substrate.

In other embodiments, it is assumed that the changes in resistivity of the substrates changes gradually, as described above. In this way, substrates may be sampled at the measurement station 130, and this sampled value is then used to process some number of substrates. For example, every tenth substrate may be measured for resistivity and processing based on that measurement may be performed on a larger number of substrates. Note that the measured substrate may or may not be one of the substrates processed based on this measurement.

In some embodiments, as described above, a conveyance system 150 is employed where substrates 160 move from the measurement station 130 to the ion implanter 110. Due to the distance between these two apparatuses, there may be a number of substrates 160 that have passed the measurement station 130 but not reached the ion implanter 110. In one embodiment, the controller 120 is aware of the number of substrates 160 between these two components and properly correlates the measurement of a substrate 160 to the ion implanting of that substrate 160 at a later time. In another embodiment, the controller 120 uses the measurement presently made at the measurement station 130 to change the dose at the ion implanter 130. In other words, the dose for a particular substrate 160 is varied based on the resistivity measurement of a different substrate 160. In another embodiment, substrates 160 are only sampled at the measurement station, such that a plurality of substrates 160 is processed in accordance with the resistivity measurement of a single substrate 160. Other variations are possible. For example, as described above, the process changes do not necessarily occur at the ion implanter 110. These process changes may be at the anneal station or at another process step.

In addition, the conveyance system 150 may also be configured such that substrates enter the ion implanter 110 prior to the measurement station 130. In this embodiment, the measured resistivity is applied to a subsequent substrate 160 entering the ion implanter 110.

Several different mechanisms which use the measured resistivity of a substrate 160 to alter the processing of that, or a different substrate, are disclosed. In each of these embodiments, the processing of the substrate 160 is varied such that the sheet resistance of the processed substrate is within a predetermined range. Otherwise, if all substrates are treated identically, the resulting sheet resistance of the substrate is correlated to its underlying resistivity. This may create undesired variation in performance, such as if the substrates 160 are used to create solar cells. By measuring the resistivity, the subsequent processing can be varied to allow a BSF to be applied, where these BSFs all have a sheet resistance within an acceptable range, regardless of the underlying resistivity.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of processing substrates, comprising:
    measuring a resistivity of a first substrate; and
    processing a second substrate based on said measured resistivity to achieve a desired sheet resistance,
    wherein said first substrate and said second substrate are the same substrate, and wherein said processing comprises implanting ions into said second substrate and subsequently subjecting said second substrate to a second processing step, wherein said second processing step is varied based on said measured resistivity.

2. The method of claim 1, wherein said measuring is performed prior to said processing, said processing comprises implanting ions into said second substrate, and a dose implanted into said second substrate is determined based on said measured resistivity.

3. The method of claim 1, wherein said measuring step is performed after said ion implanting step.

4. The method of claim 1, wherein said measuring step is performed before said ion implanting step.

5. The method of claim 1, wherein said second processing step comprises an anneal cycle.

6. The method of claim 1, wherein said processing comprises implanting ions into said second substrate, and said first substrate comprises a substrate processed prior to said second substrate, and said dose is determined based on said measured resistivity of said substrate processed prior to said second substrate.

7. The method of claim 5, wherein said resistivity of said substrate processed prior to said second substrate is measured after said ion implanting step and a dose is varied for said second substrate based on said measured resistivity.

8. The method of claim 1, further comprising a plurality of said second substrates, wherein said measuring step measures resistivity of said first substrate; and said processing of said plurality of second substrates is based on said measured resistivity.

9. The method of claim 1, wherein said measuring step occurs prior to said processing step, wherein said first substrate is measured subsequent to said second substrate, and said processing of said second substrate is varied based on said measured resistivity of said first substrate.

10. An apparatus for processing substrates comprising:
    a measurement station to measure resistivity of said substrates;
    a controller to determine a dose based on said measured resistivity; and
    an ion implanter to implant said dose in said substrates, wherein said controller is in communication with a database, wherein said controller stores said measured resistivity of said substrates and an indication of said substrates in said database, wherein said controller identifies a substrate in said ion implanter based on said indication, and wherein said dose for said identified substrate is based on said measured resistivity of said substrate.

11. The apparatus of claim 10, further comprising a conveyance system between said measurement station and said ion implanter, wherein said controller is aware of a number of substrates disposed on said conveyance system that have been measured and not implanted, and wherein said indication of a substrate is based on a position of said substrate in said conveyance system.

12. The apparatus of claim 10, wherein said indication comprises a scribe mark, and said apparatus comprises an optical system to detect said scribe mark.

13. A method of processing a substrate to form a solar cell, the method comprising:
    measuring a resistivity of said substrate;
    storing said measured resistivity in a database;
    selecting a dose to be used in the creation of a back surface field (BSF) based on said stored measured resistivity; and
    implanting ions into said substrate using said selected dose to create said BSF.

14. The method of claim 13, wherein said resistivity is measured prior to said implanting.

15. The method of claim 13, further comprising:
    storing an indication of an identity of said substrate in said database during said measuring step;
    identifying said substrate prior to said implanting; and
    retrieving measured resistivity from said database based on said identifying.

16. The method of claim 13, wherein said dose is modified by changing a scan speed of an ion implanter.

17. The method of claim 13, wherein said dose is modified by changing an ion beam current of an ion implanter.

* * * * *